US010418597B2

(12) United States Patent
Li et al.

(10) Patent No.: US 10,418,597 B2
(45) Date of Patent: Sep. 17, 2019

(54) DISPLAY PANEL, DISPLAY DEVICE, AND FABRICATION METHOD FOR DISPLAY PANEL

(71) Applicants: Shanghai Tianma AM-OLED Co., Ltd., Shanghai (CN); Tianma Micro-electronics Co., Ltd., Shenzhen (CN)

(72) Inventors: Chunyang Li, Shanghai (CN); Bozhang Sun, Shanghai (CN); Minfu Zhang, Shanghai (CN)

(73) Assignees: Shanghai Tianma AM-OLED Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 133 days.

(21) Appl. No.: 15/662,760

(22) Filed: Jul. 28, 2017

(65) Prior Publication Data
US 2018/0190946 A1 Jul. 5, 2018

(30) Foreign Application Priority Data
Dec. 29, 2016 (CN) .......................... 2016 1 1245888

(51) Int. Cl.
*H01L 51/56* (2006.01)
*G09G 3/3208* (2016.01)
(Continued)

(52) U.S. Cl.
CPC ........... *H01L 51/56* (2013.01); *G09G 3/3208* (2013.01); *G09G 3/36* (2013.01); *H01L 27/3276* (2013.01); *G09G 2300/0426* (2013.01); *G09G 2320/0223* (2013.01); *G09G 2320/0233* (2013.01); *H01L 51/0011* (2013.01); *H01L 51/502* (2013.01)

(58) Field of Classification Search
None
See application file for complete search history.

(56) References Cited

U.S. PATENT DOCUMENTS

| 2010/0156945 | A1* | 6/2010 | Yoshida | G02F 1/1345 |
| | | | | 345/690 |
| 2016/0329350 | A1 | 11/2016 | Na et al. | |
| 2018/0039146 | A1* | 2/2018 | Tanaka | G02F 1/1343 |

FOREIGN PATENT DOCUMENTS

| CN | 101086995 A | 12/2007 |
| CN | 101401143 A | 4/2009 |

(Continued)

*Primary Examiner* — Ifedayo B Iluyomade
(74) *Attorney, Agent, or Firm* — Anova Law Group, PLLC

(57) ABSTRACT

A display panel, a display device, and a fabrication method for the display panel are provided. The display panel comprises an array substrate comprising a display region, wherein the display region comprises a plurality of data lines, a plurality of scanning lines, and a plurality of first pixel regions defined by the plurality of data lines and the plurality of scanning lines intersecting the plurality of data lines. At least two data lines have different lengths, at least one second pixel region is disposed between a first pixel region corresponding to a data line and an edge of the display region corresponding to the data line. The at least one second pixel region at least comprises a first metal line segment and a second metal line segment arranged in parallel, and the first metal line segment is disposed on an extension line of the data line.

20 Claims, 8 Drawing Sheets

(51) Int. Cl.
*G09G 3/36* (2006.01)
*H01L 27/32* (2006.01)
*H01L 51/50* (2006.01)
*H01L 51/00* (2006.01)

(56) References Cited

FOREIGN PATENT DOCUMENTS

| | | | |
|---|---|---|---|
| CN | 102053434 A | 5/2011 | |
| CN | 102789755 A | 11/2012 | |
| CN | 103456743 A | 12/2013 | |
| CN | 106847199 A | 6/2017 | |
| JP | WO2016140281 | * 9/2015 | ............. G02F 1/133 |

* cited by examiner

DISPLAY PANEL, DISPLAY DEVICE, AND FABRICATION METHOD FOR DISPLAY PANEL

CROSS-REFERENCES TO RELATED APPLICATIONS

This application claims priority of Chinese Patent Application No. 201611245888.0, filed on Dec. 29, 2016, the entire contents of which are hereby incorporated by reference.

FIELD OF THE DISCLOSURE

The present disclosure generally relates to the field of display and, more particularly, relates to a display panel, a display device, and a fabrication method for the display panel.

BACKGROUND

An organic light-emitting display panel generally includes a plurality of scanning lines and a plurality of data lines, in which every two scanning lines and every two data lines intersect each other to define a pixel region. That is, every two adjacent scanning lines and every two adjacent data lines intersect each other to define a pixel region. The plurality of scanning lines and the plurality of data lines intersect each other to define a plurality of pixel regions, which are arranged in an array.

Each pixel region corresponds to a light-emitting unit. Each pixel region includes a storage capacitor for storing a display signal and, accordingly, each data line corresponds to a plurality of parallel storage capacitors. Given that the storage capacitance of each pixel region is equal, in a traditional rectangular display panel, because the number of pixel regions corresponding to each data line is equal, the capacitance of the total storage capacitor corresponding to each data line is also equal. Thus, the charge and discharge time of capacitors for different data lines is equal, and the hold time of data signals by the capacitors is also equal.

With the expansion of the display product applications, various display panels with a non-traditional (i.e. irregular) shape (i.e., irregular display panels) are emerging, in which the display panel and the display region have a circular shape or non-rectangular irregular polygonal shape. In the irregular display panel, the lengths of at least two data lines are different. Because the number of pixel regions corresponding to each data line is proportional to the length of the data line, the number of storage capacitors corresponding to each data line is no longer the same in the irregular display panel. A longer data line may correspond to a larger number of storage capacitors, while a shorter data line may correspond to a smaller number of storage capacitors.

Because the number of storage capacitors corresponding to a shorter data line is smaller, each respective storage capacitor has a shorter hold time for the data signal stored on the storage capacitor. That is, the data signal on each storage capacitor corresponding to a shorter data line has a faster attenuation than the data signal on each storage capacitor corresponding to a longer data line. When the display panel displays a low gray scale image, the data signal stored on the capacitors corresponding to the shorter data line is attenuated faster than the data signal stored on the capacitors corresponding to the longer data line, and the current flowing through the organic light-emitting units of the pixel regions corresponding to the shorter data line is greater than the current flowing through the organic light-emitting units of the pixel regions corresponding to the longer data line. Accordingly, bright stripes appear at positions corresponding to shorter data lines on the organic light-emitting display panel.

The disclosed display panel, display device and fabrication method for the display panel are directed to solve one or more problems set forth above and other problems.

BRIEF SUMMARY OF THE DISCLOSURE

One aspect of the present disclosure provides a display panel. The display panel comprises an array substrate comprising a display region, wherein the display region comprises a plurality of data lines extending in a first direction and arranged in a second direction, a plurality of scanning lines extending in the second direction and arranged in the first direction, and a plurality of first pixel regions defined by the plurality of data lines and the plurality of scanning lines intersecting the plurality of data lines, wherein the plurality of first pixel regions are arranged in an array; at least two data lines have different lengths; at least one second pixel region is disposed between a first pixel region corresponding to a data line and an edge of the display region corresponding to the data line; the at least one second pixel region at least comprises a first metal line segment and a second metal line segment arranged in parallel; the first metal line segment is formed in a first metal layer; the second metal line segment is formed in a second metal layer; and the first metal line segment is disposed on an extension line of the data line.

Another aspect of the present disclosure provides a display device. The display device comprises a display panel, wherein the display panel comprises an array substrate comprising a display region comprising a plurality of data lines extending in a first direction and arranged in a second direction, a plurality of scanning lines extending in the second direction and arranged in the first direction, and a plurality of first pixel regions defined by the plurality of data lines and the plurality of scanning lines intersecting the plurality of data lines, wherein the plurality of first pixel regions are arranged in an array; at least two data lines have different lengths; at least one second pixel region is disposed between a first pixel region corresponding to a data line and an edge of the display region corresponding to the data line; the at least one second pixel region at least comprises a first metal line segment and a second metal line segment arranged in parallel; the first metal line segment is formed in a first metal layer; the second metal line segment is formed in a second metal layer; and the first metal line segment is disposed on an extension line of the data line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
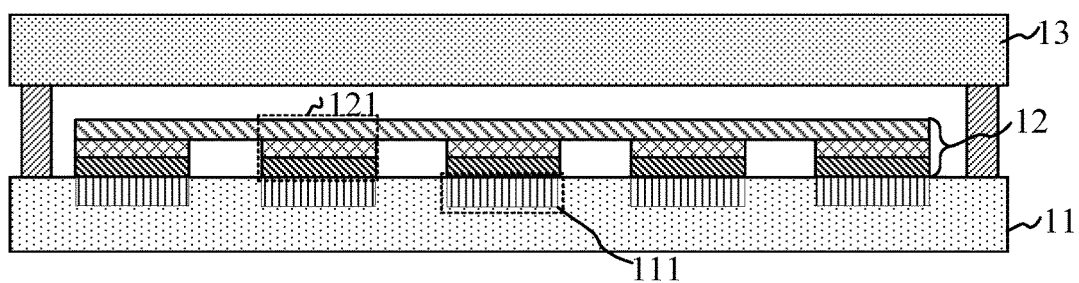
FIG. 1 illustrates a schematic view of an exemplary display panel consistent with disclosed embodiments.

FIG. 1 illustrates a schematic view of an exemplary display panel consistent with disclosed embodiments. In one embodiment, the display panel may be an organic light-emitting display panel. As shown in FIG. 1, the display panel 100 may include an array substrate 11, a light-emitting material layer 12, and a cover glass or cover lens 13. The array substrate 11 may include a plurality of first pixel regions 111, and the light-emitting material layer 12 may include a plurality of light-emitting units 121. The plurality of light-emitting units 121 may one-to-one correspond to the plurality of first pixel regions 111. That is, each light-emitting unit 121 may correspond to a first pixel region 111.

Luminance of the light-emitting unit 121 may be positively correlated with the light emission current flowing through the light-emitting unit 121. The light emission current flowing through the light-emitting unit 121 may be proportional to the square of the difference between the applied voltage drop across the driving transistor in the first pixel region 111 and the data signal voltage of the storage capacitor in the first pixel region 111.

It should be noted that, the disclosed display panel may also be a liquid crystal display panel or other types of display panels, which is not limited by the present disclosure. The display panel may be any appropriate type of display panels capable of displaying videos and/or images, such as plasma display panel (PDP), field emission display (FED) panel, liquid crystal display (LCD) panel, organic light-emitting diode (OLED) display panel, light-emitting diode (LED) display panel, quantum dots (QDs) display panel, electrophoretic display panels (i.e., e-readers) or other types of display panels.

When the display panel is an LCD panel, in one embodiment, the display panel may include an array substrate, a color film substrate, and a liquid crystal layer disposed between the array substrate and the color film substrate. The array substrate may include a plurality of first pixel regions. The color film substrate may include a plurality of color filter units. The plurality of color filter units may one-to-one correspond to the plurality of first pixel regions. That is, each color filter unit may correspond to a first pixel region.

Figure 2:
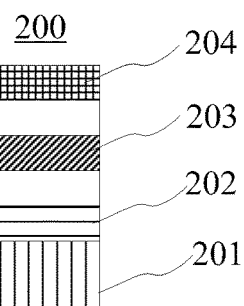
FIG. 2 illustrates a schematic view of an exemplary array substrate of an exemplary display panel in FIG. 1 consistent with disclosed embodiments.

FIG. 2 illustrates a schematic view of an exemplary array substrate of an exemplary display panel in FIG. 1 consistent with disclosed embodiments. As shown in FIG. 2, the array substrate 200 may include a base substrate 201, a first metal layer 202, a second metal layer 203, and a third metal layer 204. The first metal layer 202 and the second metal layer 203 may be electrically insulated from each other, and the second metal layer 203 and the third metal layer 204 may be electrically insulated from each other.

Figure 3:
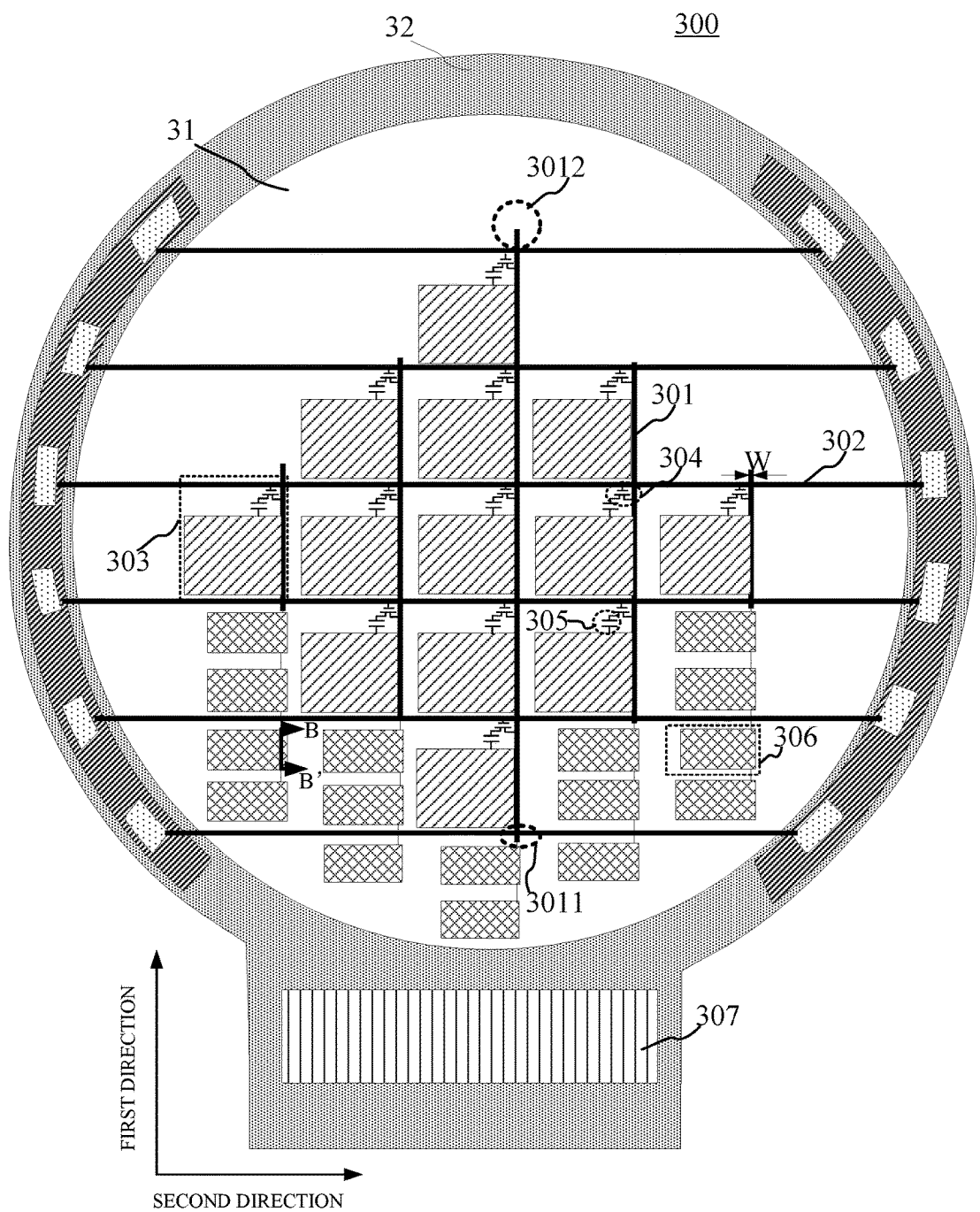
FIG. 3 illustrates a schematic view of an exemplary relative positional relationship of a display region, a plurality of scanning lines, a plurality of data lines, a plurality of first pixel regions and a plurality of second pixel regions of an exemplary array substrate in FIG. 2 consistent with disclosed embodiments.

FIG. 3 illustrates a schematic view of an exemplary relative positional relationship of a display region, a plurality of scanning lines, a plurality of data lines, a plurality of first pixel regions and a plurality of second pixel regions of an exemplary array substrate in FIG. 2 consistent with disclosed embodiments.

As shown in FIG. 3, the array substrate 300 (i.e. the array substrate 11 in FIG. 1) may include a display region 31, and a non-display region 32 surrounding the display region 31. The display region 31 may include a plurality of data lines 301 extending in a first direction and arranged in a second direction, and a plurality of scanning lines 302 extending in the second direction and arranged in the first direction. Each data line may include a first end 3011 and a second end 3012. The display region 31 may further include a plurality of first pixel regions 303 defined by the scanning lines 302 and the data lines 301, in which the scanning lines 302 and the data lines 301 may intersect or cross each other. The plurality of first pixel regions 303 may be arranged in an array.

In the disclosed embodiments, at least two of the plurality of data lines 301 may have different lengths. The display region 31 may have a polygonal shape, a circular shape, or an elliptical shape. The polygonal shape may refer to a polygon other than a rectangle and a square. That is, the display region 31 may have various shapes other than the rectangle and square.

The first direction and the second direction, and the shape of the display region 31 in FIG. 3 are for illustrative purposes and are not intended to limit the scope of the present disclosure.

The non-display region 32 may include a connection wire distribution region 307. The connection wire distribution region 307 may be configured in the non-display region 32 near the first ends 3011 of the data lines 301.

Each first pixel region 303 of the array substrate 300 may include a thin film transistor 304 and a storage capacitor 305. The storage capacitor 305 may be configured to store a display signal transmitted to the first pixel region 303 through the data line 301.

In the disclosed embodiments, the display panel may display images by dividing the images into multiple frames and time-sharing. When one image frame (i.e. one frame of image) is being displayed, each data line 301 may transmit a corresponding display signal simultaneously, and each scanning line 302 may sequentially transmit a corresponding scan signal and, accordingly, select the storage capacitors 305 of the respective row of first pixel regions 303 to store the display signals. A certain time interval may be provided between two successive image frames.

During the period when one image frame is being displayed, the display signal stored in each first pixel region 303 may be often desired to be held until the display signal of a next image frame is inputted to the first pixel region 303 when displaying the next image frame, such that the display panel may be able to display a smooth image.

Each data line 301 may correspond to a plurality of first pixel regions 303 arranged in a column. When one image frame is being displayed, each data line 301 may sequentially transmit the data signal to the storage capacitors 305 of the corresponding first pixel regions 303 for storage. Thus, the load of each data line 301 may include a plurality of storage capacitors in parallel.

A longer data line 301 may correspond to a larger number of first pixel regions 303 and, thus, the longer data line 301 may correspond to a larger number of parallel storage capacitors 305. A shorter data line 301 may correspond to a smaller number of first pixel regions 303 and, thus, the short data line 301 may correspond to a smaller number of parallel storage capacitors 305. From the point of view of the data line 301, a plurality of storage capacitors 305 in parallel, which are corresponding to the same data line 301, may be considered as a total storage capacitor. Thus, a longer data line 301 may have a larger total storage capacitance, while a shorter data line 301 may have a smaller total storage capacitance.

The time period for the capacitor to hold the voltage signal stored on the capacitor may be positively correlated with the capacitance of the capacitor. Thus, for a shorter data line 301 corresponding to a smaller total storage capacitance, the corresponding total storage capacitor may have shorter signal holding time. That is, the data signal stored on a shorter data line 301 may be released faster. When the gray scale test is performed on the display panel, because the data voltage signal stored by the total storage capacitor corresponding to the shorter data line 301 is released faster, the data voltage signals stored on the respective storage capacitors may drop rapidly below a predetermined threshold value before the display signals of the next frame are inputted into the respective pixel regions. Accordingly, in the gray scale test, a bright stripe may appear in the image displayed at the position corresponding to the shorter data line 301.

To suppress the bright stripes appearing in the image displayed at the positions corresponding to the shorter data lines, in the disclosed embodiments, a different number of auxiliary capacitors may be provided to each data line.

In one embodiment, the number of the auxiliary capacitors provided to each data line may be inversely proportional to the length of the data line. According to the lengths of the data lines, a different number of auxiliary capacitors may be provided to the data lines having different lengths, such that the equalization of the total load capacitance of each data line may be realized. Accordingly, the bright stripe appearing in the medium-low gray scale test on the display panel, which are caused by the substantially small capacitance of the total storage capacitor corresponding to the shorter data line, may be suppressed.

In one embodiment, as shown in FIG. 3, introducing a different number of auxiliary capacitors to each data line 301 may include: configuring at least one second pixel region 306 between each data line 301 and the edge of the display region 31 corresponding to the data line 301. That is, at least one second pixel region 306 may be disposed between the data line 301 and the corresponding edge of the display region 31.

In other words, for each data line 301, at least one second pixel region 306 may be disposed between the first pixel region 303 corresponding to the data line 301 and the edge of the display region 31 corresponding to the same data line 301. In one embodiment, the number of the second pixel regions 306 corresponding to each data line 301 may be inversely proportional to the length of the data line 301. That is, a longer data line 301 may correspond to a smaller number of second pixel regions 306, while a shorter data line 301 may correspond to a greater number of second pixel regions 306.

In the disclosed embodiments, for each data line 301, at least one second pixel region 306 may be disposed between the first pixel regions 303 corresponding to the data line 301 and the edge of the display region 31 corresponding to the same data line 301. That is, for each data line 301, at least one second pixel region 306 may be disposed between the corresponding first pixel regions 303 and the corresponding edge of the display region 31.

In one embodiment, for each data line 301, the second pixel region 306 may be disposed between the first end 3011 of the data line 301 and the edge of the display region 31 corresponding to the same data line 301, in which the first end 3011 is close to the connection wire distribution region 307. That is, for each data line 301, the respective second pixel region 306 may be disposed at the edge of the display region 31 adjacent to the first end 3011 of the data line 301.

Figure 4:
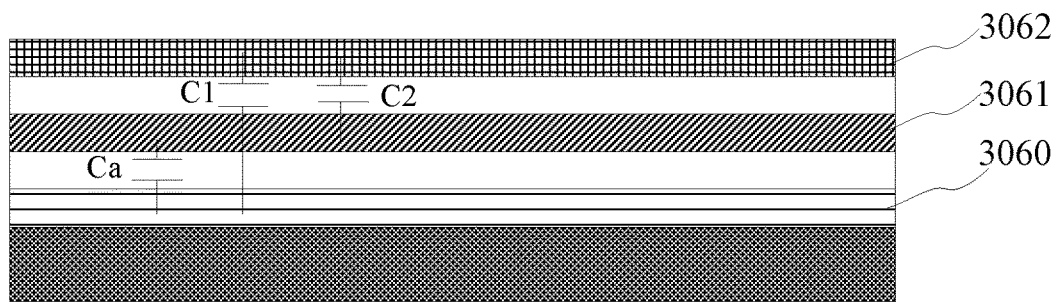
FIG. 4 illustrates a schematic cross-sectional view along BB' of an exemplary array substrate in FIG. 3 consistent with disclosed embodiments.

FIG. 4 illustrates a schematic cross-sectional view along BB' of an exemplary array substrate in FIG. 3 consistent with disclosed embodiments. As shown in FIG. 4, the second pixel region 306 may at least include a first metal line segment 3060 and a second metal line segment 3061 arranged in parallel. The first metal line segment 3060, the second metal line segment 3061, and the insulating structure between the first metal line segment 3060 and the second metal line segment 3061 may form a capacitor structure. The capacitor structure between the first metal line segment 3060 and the second metal line segment 3061 may be configured to be an auxiliary capacitor Ca.

That is, for each data line 301, according to the length of the data line 301, a different number of auxiliary capacitors Ca may be provided to the data line 301 by configuring a different number of second pixel regions 306. In one embodiment, the number of the second pixel regions 306 provided to each data line 301 may be negatively correlated with the length of the data line 301.

In the disclosed embodiments, the first line segment 3060 may be disposed in the first metal layer 202, and the first metal line segment 3060 may be disposed on the extension line of the data line 301. That is, the first metal line segment 3060 may be disposed in the same layer as the data line 301.

In other words, the data line 301 may also be disposed in the first metal layer 202. Each first metal line segment 3060 may be electrically connected to the corresponding data line 301.

The second metal line segment 3061 may be disposed in the second metal layer 203. In one embodiment, the second metal layer 203 may be a metal layer, which forms a storage capacitor with the data line 301 in the first pixel region 303.

Figure 5A:
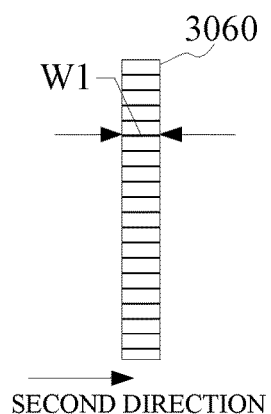
FIG. 5A illustrates a schematic view of an exemplary first metal line segment in FIG. 4 consistent with disclosed embodiments.
Figure 5B:
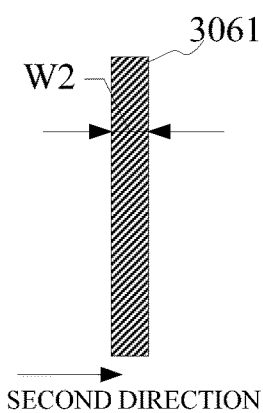
FIG. 5B illustrates a schematic view of an exemplary second metal line segment in FIG. 4 consistent with disclosed embodiments.

FIG. 5A illustrates a schematic view of an exemplary first metal line segment in FIG. 4 consistent with disclosed embodiments. FIG. 5B is a schematic view of an exemplary second metal line segment in FIG. 4 consistent with disclosed embodiments.

In one embodiment, as shown in FIG. 5A, the first metal line segment 3060 may have a width of W1 in the second direction, and the data line 301 may have a width of W in the second direction, and W1 may be greater than W.

In another embodiment, as shown in FIG. 5B, the second metal line segment 3061 may have a width of W2 in the second direction, and the data line 301 may have a width of W in the second direction, and W2 may be greater than W. Thus, in the second pixel region 306, the capacitance of the auxiliary capacitor Ca may be increased by increasing the width W1 of the first metal line segment 3060 and the width W2 of the second metal line segment 3061.

In certain embodiments, for different data lines 301, the width W1 of the first metal line segment 3060 and the width W2 of the second metal line segment 3061 in the corresponding second pixel region 306 may be further configured according to the length of the data line 301. For example, for a longer data line 301, the width W1 of the first metal line segment 3060 and the width W2 of the second metal line segment 3061 in the corresponding second pixel region 306 may be configured to be smaller. For a shorter data line 301, the width W1 of the first metal line segment 3060 and the width W2 of the second metal line segment 3061 in the corresponding second pixel region 306 may be configured to be larger.

Accordingly, the auxiliary capacitor Ca in a single second pixel region 306 corresponding to a shorter data line 301 may have a larger capacitance than the auxiliary capacitor Ca in a single second pixel region 306 corresponding to a longer data line. Thus, through providing a smaller number of second pixel regions 306 to a short data line, the equalization of the total load capacitance corresponding to each data line 301 may still be realized.

Even when the number of the second pixel regions 306 for a shorter data line is reduced, the equalization of the total load capacitance corresponding to each data line 301 may still be realized, by increasing the width W1 of the first metal line segment 3060 and the width W2 of the second metal line segment 3061 for the shorter data line.

Figure 5C:
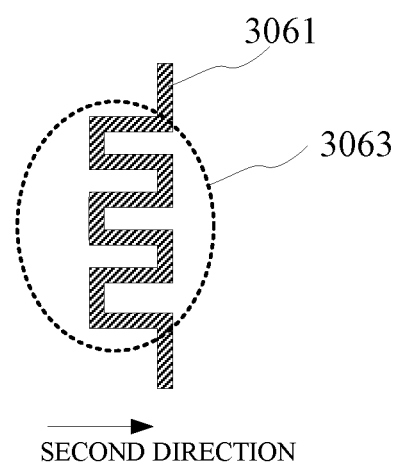
FIG. 5C illustrates a schematic view of another exemplary second metal line segment in FIG. 4 consistent with disclosed embodiments.

FIG. 5C illustrates a schematic view of another exemplary second metal line segment in FIG. 4 consistent with disclosed embodiments. As shown in FIG. 5C, the second metal line segment 3061 may include a folded line segment 3063. By configuring the folded line segment 3063 in the second metal line segment 3061, the overlapped area between the second metal line segment 3061 and the first metal line segment 3060 may be increased. That is, by configuring the folded line segment 3063 in the second metal line segment 3061, the orthogonal projection of the second metal line segment 3061 and the orthogonal projection of the first metal line segment 3060 onto the base substrate may have an increased overlapped area. Thus, the capacitance of the auxiliary capacitor Ca in the second pixel region 306 may be increased.

Further, the lengths of the folded line segments 3063 in the second metal line segments 3061 in the second pixel regions 306 may be inversely proportional to the lengths of the corresponding data lines 301. That is, for a longer data line 301, the length of the folded line segment 3063 of the second metal line segment 3061 in the respective second pixel region 306 may be shorter, and the auxiliary capacitor Ca in the respective single second pixel region 306 may have a smaller capacitance. For a shorter data line 301, the length of the folded line segment 3063 of the second metal line segment 3061 in the respective second pixel region 306 may be longer, and the auxiliary capacitor Ca in the respective single second pixel region 306 may have a greater capacitance.

Thus, through providing a smaller number of second pixel regions 306 to a shorter data line 301, the capacitance of the total load capacitor corresponding to the shorter data line 301 may still be equal to the capacitance of the total load capacitor corresponding to a longer data line 301.

Referring to FIG. 4, the second pixel region 306 may further include a third metal line segment 3062 parallel to the first metal line segment 3060. In the second pixel region 306, a first parasitic capacitor C1 may be formed between the first metal line segment 3060 and the third metal line segment 3062, and a second parasitic capacitor C2 may be between the second metal line segment 3061 and the third metal line segment 3062. The first parasitic capacitor C1, the second parasitic capacitor C2 and the auxiliary capacitor Ca in the second pixel region may be connected in parallel.

By disposing the third metal line segment 3062, which is parallel to the first metal line segment 3060, in the second pixel region 306, the total capacitance in the second pixel region 306 may be increased, facilitating the equalization of the respective total load capacitance for each data line through providing a reduced number of second pixel regions to a short data line. Further, the third metal line segment 3062 may be disposed in the same layer as the scanning line 302.

In certain embodiments, as shown in FIG. 3, to equalize the total load capacitance of each data line 301, the width W of the data line 301 may be configured according to the length of the data line 301. For example, the width W of each data line 301 may be configured to be inversely proportional to the length of the data line 301. Because the capacitance of the storage capacitor corresponding to the data line is proportional to the width of the data line, through configuring a longer data line to have a smaller width and a shorter data line to have a greater width, the equalization of the total load capacitance for each data line may be realized. Through configuring the data lines having different lengths to have different widths and, meanwhile, disposing the second pixel regions between the data lines and the corresponding edges of the display regions, the equalization of the total load capacitance for each data line may be realized by a reduced number of second pixel regions.

In the disclosed display panel with an irregular shape, for the data lines having different lengths, by introducing a different number of second pixel regions to the corresponding edges of the display region, the number of respective auxiliary capacitors may be determined according to the length of each data line. In addition, the auxiliary capacitor is disposed near the connection wire distribution region. Accordingly, the total load capacitance of each data line may be equalized. Thus, when the gray scale test is performed on the display panel with an irregular shape, the bright stripes corresponding to the short data lines may be suppressed to be displayed on the display panel. The irregular shape may refer to a shape other than a rectangle and a square, such as a polygonal shape, a circular shape, or an elliptical shape.

Figure 6:
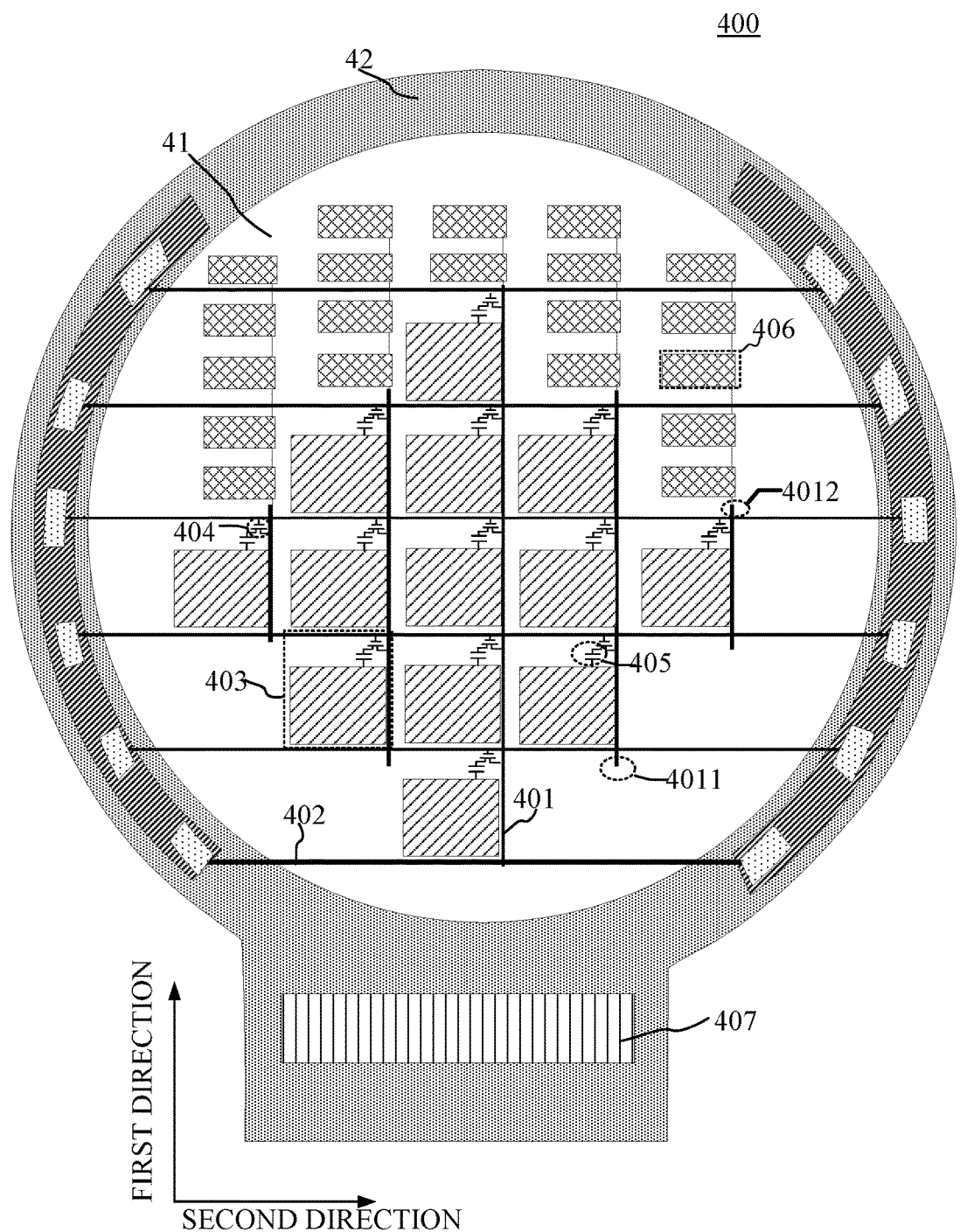
FIG. 6 illustrates a schematic view of another exemplary relative positional relationship of a display region, a plurality of scanning lines, a plurality of data lines, a plurality of first pixel regions, and a plurality of second pixel regions of an exemplary array substrate in FIG. 2 consistent with disclosed embodiments.

FIG. 6 illustrates a schematic view of another exemplary relative positional relationship of a display region, a plurality of scanning lines, a plurality of data lines, a plurality of first pixel regions, and a plurality of second pixel regions of an exemplary array substrate in FIG. 2 consistent with disclosed embodiments.

Similar to the array substrate in FIG. 3, as shown in FIG. 6, the array substrate 400 may include a display region 41, and a non-display region 42 surrounding the display region 41. The display region 41 may include a plurality of data lines 401 extending in a first direction and arranged in a second direction; a plurality of scanning lines 402 extending in the second direction and arranged in the first direction, a plurality of first pixel regions 403 arranged in an array. Each data line may include a first end 4011 and a second end 4012. The lengths of at least two of the plurality of data lines 401 may be different. The non-display area 42 may be configured with a connection wire distribution region 407.

At least one second pixel region 406 may be disposed between the first pixel regions 403 corresponding to each data line 401 and the edge of the display region 41 corresponding to the data line 401. In the disclosed embodiments, for each data line 401, at least one second pixel region 406 may be disposed between the first pixel regions 403 corresponding to the data line 401 and the edge of the display region 41 corresponding to the data line 401. That is, for each data line 401, at least one second pixel region 406 may be disposed between the corresponding first pixel regions 403 and the corresponding edge of the display region 41.

Similar to the array substrate in FIG. 3, the second pixel region 406 shown in FIG. 6 may include a first metal line segment and a second metal line segment in parallel. The first metal line segment may be disposed on the extension line of the data line, and the first metal line segments disposed on the extension line of the same data line may be connected to the data line. An auxiliary capacitor may be formed between the second metal line segment and the first metal line segment.

In certain embodiments, in the second pixel region 406, the width of the first metal line segment in the second direction may be greater than the width of the data line in the second direction. The capacitance of the auxiliary capacitor in the second pixel region may be increased by increasing the width of the first metal line segment in the second direction and the width of the second metal line segment in the second direction, facilitating the equalization of the total load capacitance of each data line.

In certain embodiments, the second metal line segment may include a folded line segment. The capacitance of the auxiliary capacitor in the second pixel region may be increased, by disposing a folded line segment in the second metal line segment to increase the area of the second metal line segment parallel to the first metal line segment. Further, the length of the folded line segment of the second metal line segment in the second pixel region corresponding to different data lines may be inversely proportional to the length of the corresponding data line. Thus, the equalization of the total load capacitance for each data line may still be implemented through providing a smaller number of second pixel regions to a shorter data line.

In certain embodiments, the second pixel region 406 may further include a third metal line segment in parallel to the first metal line segment. In the second pixel region 406, a first parasitic capacitor may be formed between the first metal line segment and the third metal line segment, and a second parasitic capacitor may be disposed between the second metal line segment and the third metal line segment. The first parasitic capacitor, the second parasitic capacitor, and the auxiliary capacitor in the second pixel region 406 may be connected in parallel. By introducing the third metal line segment in the second pixel region 406 to increase the capacitance in the second pixel region 406, the capacitance of the total capacitor in a single second pixel region 406 corresponding to a shorter data line 401 may be increased.

In certain embodiments, the width W of the data line 401 in the second direction may be inversely proportional to the length of the data line 401. In particular, through configuring the data lines 401 to have different widths W and, meanwhile, disposing the second pixel regions 406 between the data lines 401 and the corresponding edges of the display region 41, the equalization of the total load capacitance for each data line may be realized.

Different from the array substrate shown in FIG. 3, in FIG. 6, the connection wire distribution region area 407 may be disposed in the non-display region 42 near the first end 4011 of the data line 401, and the second pixel region 406 corresponding to the data line 401 may be disposed between the second end 4012 of the data line 401 and the edge of the display region 41 adjacent to the second end 4012 of the data line 401. That is, the second pixel region 406 corresponding to the data line 401 may be disposed at the edge of the display region 41 adjacent to the second end 4012 of the data line 401.

Because the data lines 401 are connected to the connection wires (not shown in FIG. 6) in the connection wire distribution region 407 in one-to-one correspondence, when the second pixel region 406 is disposed between the second end 4012 of the data line 401 and the edge of the display region 41 corresponding to the second end 4012 of the data line 401, the signal outputted from the connection wire distribution region 407 may be transmitted to the first pixel region 403 first and then to the second pixel region 406. As a comparison, in the array substrate shown in FIG. 3, the signal outputted from the connection wire distribution region 307 in the array substrate may be first transmitted to at least one second pixel region 306 and then to the first pixel region 303. Thus, in the array substrate shown in FIG. 6, the signal may have a smaller attenuation when being transmitted from the data line 401 to the first pixel region 403.

Figure 7:
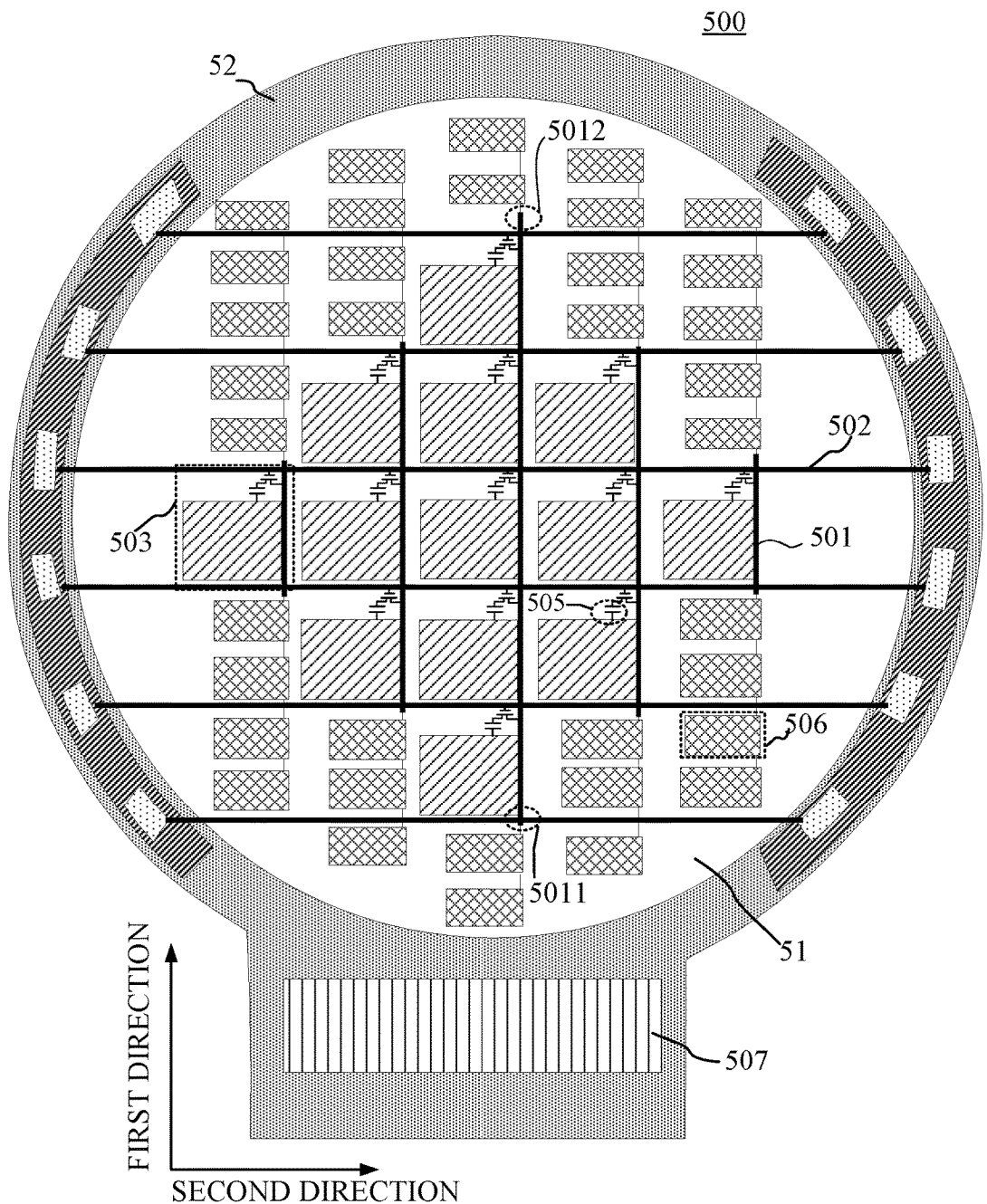
FIG. 7 illustrates a schematic view of another exemplary relative positional relationship of a display region, a plurality of scanning lines, a plurality of data lines, a plurality of first pixel regions, and a plurality of second pixel regions of an exemplary array substrate shown in FIG. 2.

FIG. 7 illustrates a schematic view of another exemplary relative positional relationship of a display region, a plurality of scanning lines, a plurality of data lines, a plurality of first pixel regions, and a plurality of second pixel regions of an exemplary array substrate in FIG. 2.

Similar to the array substrates shown in FIG. 3 and FIG. 6, as shown in FIG. 7, the array substrate 500 may include a display region 51 having a non-rectangular shape and a non-display region 52 surrounding the display region 51. The display region 51 may include a plurality of data lines 501 extending in a first direction and arranged in a second direction; a plurality of scanning lines 502 extending in the second direction and arranged in the first direction, and a plurality of first pixel regions 503 arranged in an array (same as the pixel region 111 in FIG. 1). Each first pixel region 503 may include a storage capacitor 505. At least two of the plurality of data lines 501 may have different lengths. At least one second pixel region 506 may be disposed between the first pixel regions 503 corresponding to each data line 501 and the edge of the display region 51 corresponding to the data line 501.

In the disclosed embodiments, for each data line 501, at least one second pixel region 506 may be disposed between the first pixel regions 503 corresponding to the data line 501 and the edge of the display region 51 corresponding to the data line 501. Similar to the array substrates shown in FIG. 3 and FIG. 6, the second pixel region 506 shown in FIG. 7 may include a first metal line segment and a second metal line segment in parallel. The first metal line segment may be disposed on the extension line of the data line 501, and the first metal line segments disposed on the extension line of the same data line 501 may be connected to the data line 501. An auxiliary capacitor may be formed between the second metal line segment and the first metal line segment.

In certain embodiments, the second metal line segment may include a folded line segment. The capacitance of the auxiliary capacitance in the second pixel region 506 may be increased, by introducing a folded line segment in the second metal line segment to increase the area of the second metal line segment parallel to the first metal line segment. Further, the length of the folded line segment of the second metal line segment in the second pixel region 506 corresponding to different data lines 501 may be inversely proportional to the length of the corresponding data line 501. Thus, the equalization of the total load capacitance for each data line 501 may still be implemented through providing a smaller number of second pixel regions 506 to a shorter data line 501.

In certain embodiments, the second pixel region 506 may also include a third metal line segment parallel to the first metal line segment. In the second pixel region 506, a first parasitic capacitor may be formed between the first metal line segment and the third metal line segment, and a second parasitic capacitor may be the second metal line segment and the third metal line segment. The first parasitic capacitor, the second parasitic capacitor, and the auxiliary capacitor in the second pixel region 506 may be connected in parallel. By introducing the third metal line segment in the second pixel region 506, the capacitance in the second pixel region 506 may be increased and, accordingly, the capacitance of the total capacitor in a single second pixel region 506 corresponding to a shorter data line 506 may be increased.

In certain embodiments, the width of the data line 501 in the second direction may be inversely proportional to the length of the data line 501. In particular, through configuring the data lines to have different widths and, meanwhile, disposing the second pixel regions 506 between the data lines 501 and the corresponding edges of the display region 51, the equalization of the total load capacitance for each data line 501 may be realized.

In the disclosed embodiments, the connection wire distribution region 507 may be disposed in the non-display region 52. Each data line 501 may include a first end 5011 and a second end 5012. The connection wire distribution region 507 may be disposed in the non-display region 52 near the first end 5011 of the data line 501.

Different from the array substrates shown in FIG. 3 and FIG. 6, as shown in FIG. 7, the second pixel regions 506 corresponding to the data line 501 may be disposed between the first end 5011 of the data line 501 and the edge of the display region 51 adjacent to the first end 5011 of the data line 501, and between the second end 5012 of the data line 501 and the edge of the display region 51 adjacent to the second end 5012 of the data line 501. That is, the second pixel regions 506 corresponding to the data line 501 may be disposed at the edge of the display region 51 adjacent to the first end 5011 of the data line 501, and the edge of the display region 51 adjacent to the second end 5012 of the data line 501.

In other words, for each data line 501, at least one second pixel region may be disposed between each of two ends of the data line and the corresponding edge of the display region, respectively.

At least one second pixel region may be provided at each end of the data line, respectively, such that different quantities of second pixel regions may be more conveniently configured for different data lines according to the lengths of the data lines, further facilitating the equalization of the load capacitance of each data line. Accordingly, in the gray scale test, the bright stripes of the display panel corresponding to the short data lines may be further suppressed.

Figure 8:
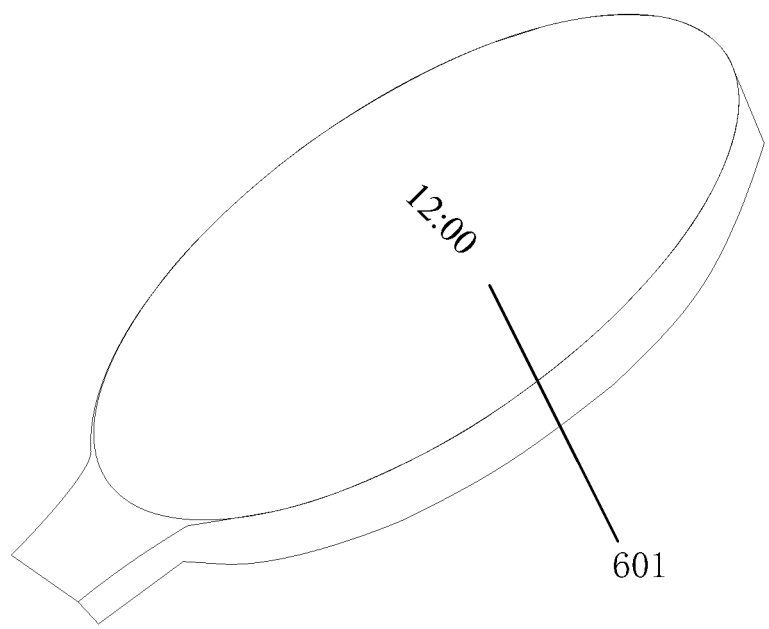
FIG. 8 illustrates a schematic view of a display device consistent with disclosed embodiments.

FIG. 8 illustrates a schematic view of a display device consistent with disclosed embodiments. As shown in FIG. 8, the display device 600 may be a wristwatch, and the display device 600 may include any one of the disclosed display panels 601. Those skilled in the art would understand that, in addition to the display panel, the disclosed display device 600 may also include other appropriate structures.

In one embodiment, when the display panel is an organic light-emitting display panel, the display device 600 may further include integrated circuits which provide display signals to the display panel. Other appropriate structures included in the disclosed display device 600 will not be further described here.

It should be noted that, although a wristwatch is shown in FIG. 8, the disclosed display device is not limited to the wristwatch. The disclosed display device 600 may be a cell phone, a computer, a tablet, a television, a monitor, and a smart wearable display device, etc. Any display device comprising any one of the disclosed display panels will fall within the scope of the present disclosure.

Figure 9:
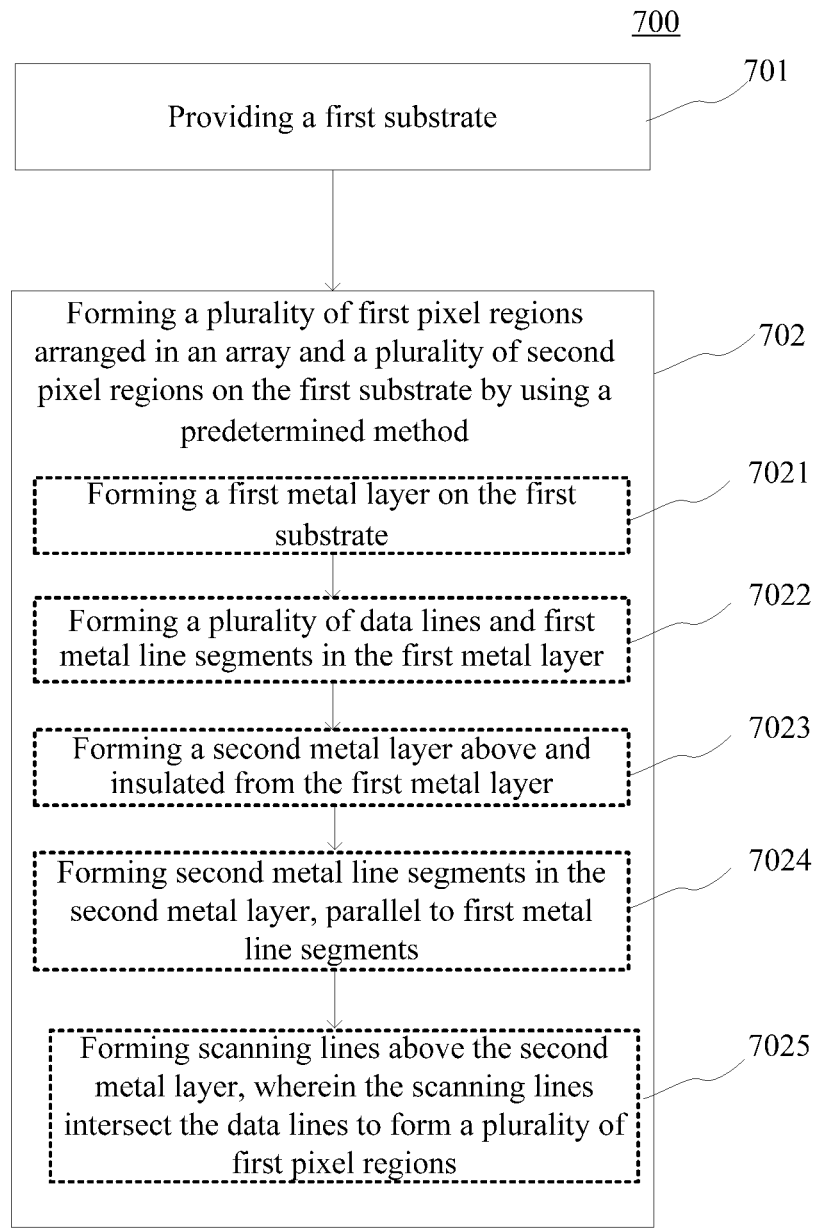
FIG. 9 illustrates a flow chart of an exemplary display panel fabrication method consistent with disclosed embodiments.

FIG. 9 illustrates a flow chart of an exemplary display panel fabrication method consistent with disclosed embodiments. As shown in FIG. 9, at the beginning, a first substrate is provided (S701). In particular, the substrate may be formed by rigid materials or flexible materials. In one embodiment, the first substrate may be a glass substrate.

After the first substrate is provided, a plurality of first pixel regions arranged in an array and a plurality of second pixel regions are formed on the first substrate by a predetermined method (S702). In particular, the plurality of first pixel regions and the plurality of second pixel regions may form a display region.

In the disclosed embodiments, the predetermined method may include the following steps. First, a first metal layer is formed on the first substrate (S7021). Thus, a plurality of data lines extending in a first direction and arranged in a second direction, and a plurality of first metal line segments on extension lines of the plurality of data lines are formed in the first metal layer through exposing the first metal layer by using a predetermined mask plate (S7022). The lengths of at least two of the plurality of data lines may be different.

A second metal layer is formed above the first metal layer (S7023). The first metal layer and the second metal layer may be insulated from each other. That is, an insulating layer may be configured between the first metal layer and the second metal layer. Next, the second metal layer is exposed by a predetermined mask plate. A plurality of second metal line segments is formed in the second metal layer through exposing the second metal layer by using a predetermined mask plate (S7024). The formed second metal line segment may be parallel to the first metal line segment.

Further, an orthogonal projection of the second metal line segment onto the first substrate may at least partially overlap with an orthogonal projection of the first metal line segment onto the first substrate. The first metal line segment and the second metal line segment may be disposed in a second pixel region. The first metal line segment and the second metal line segment in the second pixel region may form a capacitive structure. That is, the first metal line segment and the second metal line segment may form an auxiliary capacitor.

Next, a plurality of scanning lines extending in the second direction and arranged in the first direction are formed above the second metal layer, and the scanning lines intersect or cross the data lines to form a plurality of first pixel regions (S7025).

The second metal layer may have a first side facing toward the first metal layer and an opposing side. In certain embodiments, forming the plurality of scanning lines extending in the second direction and arranged in the first direction above the second metal layer may also include: forming a third metal layer above the opposing side of the second metal layer. The third metal layer and the second metal layer may be insulated from each other. Then a plurality of scanning lines extending in the second direction and arranged in the first direction may be formed in the third metal layer through exposing the third metal layer by using a predetermined mask plate.

In certain embodiments, each first pixel region, defined by the scanning lines and the data lines which intersect or cross each other, may include a storage capacitor for storing the display signal. Further, the storage capacitor may be formed by a metal line segment in the first metal layer and a metal line segment in the second metal layer.

In certain embodiments, when the scanning lines are formed through the predetermined mask plate, a plurality of third metal line segments may also be formed simultaneously. The third metal line segment may be parallel to the first metal line segment, and the third metal lines may be disposed in a second pixel region. In the second pixel region, a first parasitic capacitor may be formed between the third metal line segment and the first metal line segment arranged in parallel, and a second parasitic capacitor may be formed between the third metal line segment and the second metal line segment. The auxiliary capacitor, the first parasitic capacitor, and the second parasitic capacitor may together form a total capacitor in the second pixel region.

In the disclosed embodiments, the first pixel regions and the second pixel regions may form the display region of the display panel. The display region may have a polygonal shape, a circular shape, or an elliptical shape. The polygonal shape may be a polygonal shape other than a rectangle and a square.

According to the disclosed fabrication method for the display panel, each data line may correspond to a plurality of first pixel regions and, meanwhile, correspond to at least one second pixel region.

In certain embodiments, for each data line, the number of the second pixel regions formed between the corresponding first pixel region and the corresponding edge of the display region may be negatively correlated to the length of the data line. Accordingly, a shorter data line may correspond to a greater number of second pixel regions than a longer data line, facilitating the equalization of the total load capacitance corresponding to each data line. On the other hand, by providing the auxiliary capacitors to a shorter data line, the hold time of the display signal on the storage capacitor corresponding to the shorter data line may be extended, such that in the gray scale test, the bright stripes displaying in the display region caused by the shorter data lines may be suppressed.

In certain embodiments, in the second pixel region, the width of the first metal line segment in the second direction may be greater than the width of the data line in the second direction. Accordingly, the capacitance of the auxiliary capacitor in a single second pixel region may be increased by increasing the width of the first metal line segment in the second direction in the second pixel region. Thus, although a reduced number of second pixel regions are provided for a shorter data line, the load capacitance of the shorter data line may still be same as the load capacitance of a longer data line. Accordingly, the layout area of the display panel may be reduced.

In certain embodiments, in the second pixel region, at least one of the first metal line segment and the second metal line segment may include a folded line segment. Accordingly, at least one of the first metal line segment and the second metal line segment may include a folded line segment, thereby increasing the capacitance of the auxiliary capacitor formed between the first metal line segment and the second metal line segment and, meanwhile, reducing the layout area of the display panel.

In certain embodiments, the predetermined method may further include: forming a non-display region surrounding the display region on the array substrate, and forming a connection wire distribution region in the non-display region near a first end of the data line. The data line may include a first end and a second end.

In one embodiment, the second pixel region may be disposed between the second end of the corresponding data line and the edge of the display region adjacent to the second end of the corresponding data line. In another embodiment, the second pixel region may be disposed between the first end of the corresponding data line and the edge of the display region adjacent to the first end of the corresponding data line. In another embodiment, some second pixel regions may be disposed between the first end of the corresponding data line and the edge of the display region adjacent to the first end of the corresponding data line, and some second pixel regions may be disposed between the second end of the corresponding data line and the edge of the display region adjacent to the second end of the corresponding data line. At least one second pixel region may be configured between the data line and the edge of the display region corresponding to the data line, according to the length of the data line, facilitating the equalization of the total load capacitance of each data line. Accordingly, in the gray scale test, the bright stripes of the display panel caused by the shorter data lines may be suppressed.

Further, in certain embodiments, a second pixel region may be an actual pixel region, i.e. further including a functionality of a first pixel region.

The present disclosure provides a display panel, a display device, and a fabrication method for the display panel. In the display panel, at least one second pixel region may be disposed between the data line and the corresponding edge of the display region, and the number of the second pixel regions may be configured to be negatively correlated with the length of the corresponding data line. Accordingly, the shorter data line may substantially correspond to the same total load capacitance as the longer data line. Thus, the bright stripes appearing in the medium-low gray scale test of the organic light-emitting display panel, which are caused by the substantially small capacitance of the total storage capacitor corresponding to the shorter data line, may be suppressed.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:
an array substrate comprising a display region, wherein the display region comprises a plurality of data lines extending in a first direction and arranged in a second direction, a plurality of scanning lines extending in the second direction and arranged in the first direction, and a plurality of first pixel regions defined by the plurality of data lines and the plurality of scanning lines intersecting the plurality of data lines,
wherein the plurality of first pixel regions are arranged in an array;
at least two data lines have different lengths;
at least one second pixel region corresponding to a data line is disposed, along the first direction, between a first pixel region corresponding to the data line and an edge of the display region corresponding to the data line, and the at least one second pixel region is disposed on an extension line of the corresponding data line;
the at least one second pixel region at least comprises a first metal line segment and a second metal line segment arranged in parallel;
the first metal line segment is formed in a first metal layer;
the second metal line segment is formed in a second metal layer; and
the first metal line segment is disposed on the extension line of the corresponding data line.

2. The display panel according to claim 1, wherein:
the number of the at least one second pixel regions corresponding to the data line is negatively correlated with a length of the data line.

3. The display panel according to claim 1, wherein:
in the second direction, a width of the first metal line segment is greater than a width of the data line.

4. The display panel according to claim 1, wherein:
at least one of the first metal line segment and the second line segment comprises a folded line segment.

5. The display panel according to claim 1, wherein:
the at least one second pixel region further comprises a third metal line segment parallel to the first metal line segment; and
the third metal line segment is disposed in a same layer as the plurality of scanning lines.

6. The display panel according to claim 1, wherein:
a length of the data line is negatively correlated with a width of the data line in the second direction.

7. The display panel according to claim 1, wherein:
the array substrate further comprises a non-display region surrounding the display region;
the data line comprises a first end and a second end;
the array substrate further comprises a connection wire distribution region disposed in the non-display region near the first end of the data line; and
the at least one second pixel region is disposed at an edge of the display region adjacent to the first end of the data line.

8. The display panel according to claim 1, wherein:
the array substrate further comprises a non-display region surrounding the display region;
the data line comprises a first end and a second end;
the array substrate further comprises a connection wire distribution region disposed in the non-display region near the first end of the data line; and
the at least one second pixel region is disposed at an edge of the display region adjacent to the second end of the data line.

9. The display panel according to claim 1, wherein:
the array substrate further comprises a non-display region surrounding the display region;
the data line comprises a first end and a second end;
the array substrate further comprises a connection wire distribution region disposed in the non-display region near the first end of the data line; and
the at least one second pixel region is disposed at the edge of the display region adjacent to the first end of the data line and the edge of the display region adjacent to the second end of the data line.

10. The display panel according to claim 1, wherein:
the display region has a polygonal shape, a circular shape or, an elliptical shape; and
the at least one second pixel region is an actual pixel region, including a functionality of the first pixel region.

11. A display device, comprising a display panel, wherein the display panel comprises:
an array substrate comprising a display region comprising a plurality of data lines extending in a first direction and arranged in a second direction, a plurality of scanning lines extending in the second direction and arranged in the first direction, and a plurality of first pixel regions defined by the plurality of data lines and the plurality of scanning lines intersecting the plurality of data lines,
wherein the plurality of first pixel regions are arranged in an array;
at least two data lines have different lengths;
at least one second pixel region corresponding to a data line is disposed, along the first direction, between a first pixel region corresponding to the data line and an edge of the display region corresponding to the data line, and the at least one second pixel region is disposed on an extension line of the corresponding data line;
the at least one second pixel region at least comprises a first metal line segment and a second metal line segment arranged in parallel;
the first metal line segment is formed in a first metal layer;
the second metal line segment is formed in a second metal layer; and the first metal line segment is disposed on the extension line of the corresponding data line.

12. A display panel fabrication method, comprising:
providing a first substrate; and
forming a plurality of first pixel regions arranged in an array and a plurality of second pixel regions on the first substrate by using a predetermined method, to form a display region,
wherein the predetermined method includes:
forming a first metal layer on the first substrate and exposing the first metal layer by using a predetermined mask plate, to form a plurality of data lines extending in a first direction and arranged in a second direction, and a plurality of first metal line segments on extension lines of the plurality of data lines in the first metal layer, wherein at least two data lines have different lengths, and a first metal line segment is disposed in a second pixel region;
forming a second metal layer above the first metal layer, and exposing the second metal layer by using a predetermined mask plate to form a plurality of second metal line segments in the second metal layer, wherein the first metal layer is insulated from the second metal layer, a second metal line segment is parallel to a first metal line segment, and the second metal line segment is disposed in the second pixel region; and forming a plurality of scanning lines extending in the second direction and arranged in the first direction above the second metal layer, wherein the plurality of data lines and the plurality of scanning lines intersect each other to form the plurality of first pixel regions, wherein the second pixel region corresponding to a data line is disposed, along the first direction, between a first pixel region corresponding to the data line and an edge of the display region corresponding to the data line, and the second pixel region is disposed on an extension line of the corresponding data line.

13. The display panel fabrication method according to claim 12, wherein:

the number of the plurality of second pixel regions disposed between the first pixel region corresponding to the data line and the edge of the display region corresponding to the data line is negatively correlated with a length of the data line.

14. The display panel fabrication method according to claim 12, wherein:

in the second direction, a width of the first metal line segment is greater than a width of the data line.

15. The display panel fabrication method according to claim 12, wherein:

at least one of the first metal line segment and the second metal line segment comprises a folded line segment.

16. The display panel fabrication method according to claim 12, wherein the second metal layer has a first side facing toward the first metal layer and an opposing side, and forming the plurality of scanning lines extending in the second direction and arranged in the first direction above the second metal layer further comprises:

forming a third metal layer above the opposing side of the second metal layer, wherein the third metal layer is insulated from the second metal layer;

exposing the third metal layer by using a predetermined mask plate, to form the plurality of scanning lines in the third metal layer, wherein the plurality of scanning lines are extending in the second direction and arranged in the first direction; and forming a plurality of third metal line segments parallel to the plurality of first metal line segments during forming the plurality of the scanning lines, wherein a third metal line segment is disposed in the second pixel region.

17. The display panel fabrication method according to claim 12, wherein the data line includes a first end and a second end, and the predetermined method further comprises:

forming a non-display region around the display region on the first substrate;

forming a connection wire distribution region in the non-display region near the first end of the data line; and disposing the second pixel region at an edge of the display region adjacent to the first end of the data line.

18. The display panel fabrication method according to claim 12, wherein the data line includes a first end and a second end, and the predetermined method further comprises:

forming a non-display region around the display region on the first substrate;

forming a connection wire distribution region in the non-display region near the first end of the data line; and disposing the second pixel region at an edge of the display region adjacent to the second end of the data line.

19. The display panel fabrication method according to claim 12, wherein the data line includes a first end and a second end, and the predetermined method further comprises:

forming a non-display region around the display region on the first substrate;

forming a connection wire distribution region in the non-display region near the first end of the data line; and disposing the second pixel region at an edge of the display region adjacent to the first end of the data line and an edge of the display region adjacent to the second end of the data line.

20. The display panel fabrication method according to claim 12, wherein:

the display region has a polygonal shape, a circular shape or an elliptical shape.

* * * * *